(12) United States Patent
Vice

(10) Patent No.: US 7,570,936 B2
(45) Date of Patent: Aug. 4, 2009

(54) SUB-HARMONICALLY PUMPED MIXER

(75) Inventor: Michael W. Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 468 days.

(21) Appl. No.: 11/588,720

(22) Filed: Oct. 27, 2006

(65) Prior Publication Data

US 2008/0102777 A1    May 1, 2008

(51) Int. Cl.
*H04B 1/26* (2006.01)

(52) U.S. Cl. .................. 455/326; 455/333; 327/355

(58) Field of Classification Search ................. 455/319, 455/323, 326, 330, 332, 333; 327/113, 355, 327/356

See application file for complete search history.

(56) References Cited

U.S. PATENT DOCUMENTS

| | | | | |
|---|---|---|---|---|
| 5,826,183 A | * | 10/1998 | Apel | 455/326 |
| 6,064,872 A | * | 5/2000 | Vice | 455/326 |
| 6,861,891 B2 | * | 3/2005 | Romano | 327/355 |

* cited by examiner

*Primary Examiner*—Thanh C Le

(57) ABSTRACT

A mixing circuit is described in connection with various embodiments.

20 Claims, 6 Drawing Sheets

SUB-HARMONICALLY PUMPED MIXER

BACKGROUND

A mixer is a device that performs the task of frequency conversion by multiplying two signals. One particular type of mixer of great interest is known as a sub-harmonic mixer, which is particularly useful in high-frequency applications. FIG. 1 shows a portion of a known field effect transistor (FET)-based sub-harmonic mixer 100 using a local oscillator (LO) pumped at half the mixing frequency of the sub-harmonic mixer 100. As shown in FIG. 1, the sub-harmonic mixer 100 includes two FETs X1 and X2, with each transistor X1 and X2 being fed a local oscillation signal via an RF balun transformer (not shown) via a respective capacitor C1 and C2. Each transistor X1 and X2 is gate biased using one or more DC voltages via a respective resistor R1 and R2.

In many applications, it is useful for the mixer to avoid generating second-order harmonics as such harmonics tend to be close to frequencies of interest. However, the sub-harmonic mixer 100 of FIG. 1 has a limited isolation of the LO's second-order harmonic because Schottky junctions intrinsic in FETs X1 and X2 generate even-order harmonics. As a result, second-order harmonics in the sub-harmonic mixer 100 cannot be made to cancel when directly combined from anti-phase fundamental sources because the anti-phase information is lost in any process that generates even-order distortion.

To resolve this issue, two known remedies have been developed. The first remedy is to balance the R-port of an RF/IF diplexer circuit connected to the $RF_{OUT}$ port of FIG. 1 so that any leaked second-order information will cancel in the RF balun transformer. Unfortunately, this approach adds considerably to the size and costs of the overall system. Additionally, the conversion loss, noise figure and bandwidth of the sub-harmonic mixer 100 can be adversely affected. The second approach is to filter the leaked second-order signal outside the sub-harmonic mixer 100. However, as with the first approach, this approach can add considerably to the size and costs of the overall system. Further, this approach may not be available in situations where the second harmonic intersects with an RF band of interest.

There is a need, therefore, to provide a sub-harmonically pumped FET mixer that overcomes at least the shortcomings described above.

SUMMARY

In an illustrative embodiment, a mixing circuit includes a first field effect transistor (FET) having a gate, a source and a drain, the source of the first FET connected to a ground node, and the drain of the first FET connected to a first common node, wherein the first common node is coupled to an input of a diplexer, a first capacitor coupling the gate of the first FET to a first output of a balun transformer, a second FET having a gate, a source and a drain, the source of the second FET connected to the ground node, and the drain of the second FET connected to the first common node, a second capacitor coupling the gate of the second FET to a second output of the balun transformer, a third FET having a gate, a source and a drain with the gate of the third FET coupled to a second common node, a fourth FET having a gate, a source and a drain with the gate of the fourth FET coupled to the second common node, a third capacitor coupling the second common node to the first common node, a resistor coupling the second common node to the gate of the first FET and another resistor coupling the second common node to the gate of the second FET.

In another embodiment, a mixing circuit includes a first field effect transistor (FET) having a gate, a source and a drain, the source of the first FET connected to a ground node, and the drain of the first FET connected to a first common node, wherein the first common node is coupled to an input of a diplexer, a first capacitor coupling the gate of the first FET to a first output of a balun transformer, a second FET having a gate, a source and a drain with the source of the second FET being connected to the ground node, and the drain of the second FET being connected to the first common node, a second capacitor coupling the gate of the second FET to a second output of the balun transformer; a third capacitor and a cancellation means for canceling second-order harmonics, the cancellation means being coupled to the first common node via the third capacitor.

In yet another illustrative embodiment, a mixing circuit includes a first field effect transistor (FET) having a gate, a source and a drain, the source of the first FET connected to a ground node, and the drain of the first FET connected to a first common node, wherein the first common node is coupled to an input of a diplexer, a first capacitor coupling the gate of the first FET to a first output of a balun transformer, a second-order cancellation device having at least a first terminal and a second terminal, the second-order cancellation device configured to cancel second-order harmonics generated by the first FET, wherein the second-order cancellation device is directly coupled to a second common node via the first terminal and a third capacitor coupling the second common node to the first common node.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are clearly within the scope of the present teachings.

In the present disclosure, the terms "source" and "drain" as pertaining to a field effect transistor (FET) can be used interchangeably. That is, because the sources and drains for many FETs have no discernable differences, the terms should be considered interchangeable unless otherwise stated. Accordingly, while the usage of these terms in the following descriptions is made consistent with traditional usage for ease of explanation, sources and drains may be considered interchangeable or thought of as merely a first end and second end of a FET channel.

Figure 1:
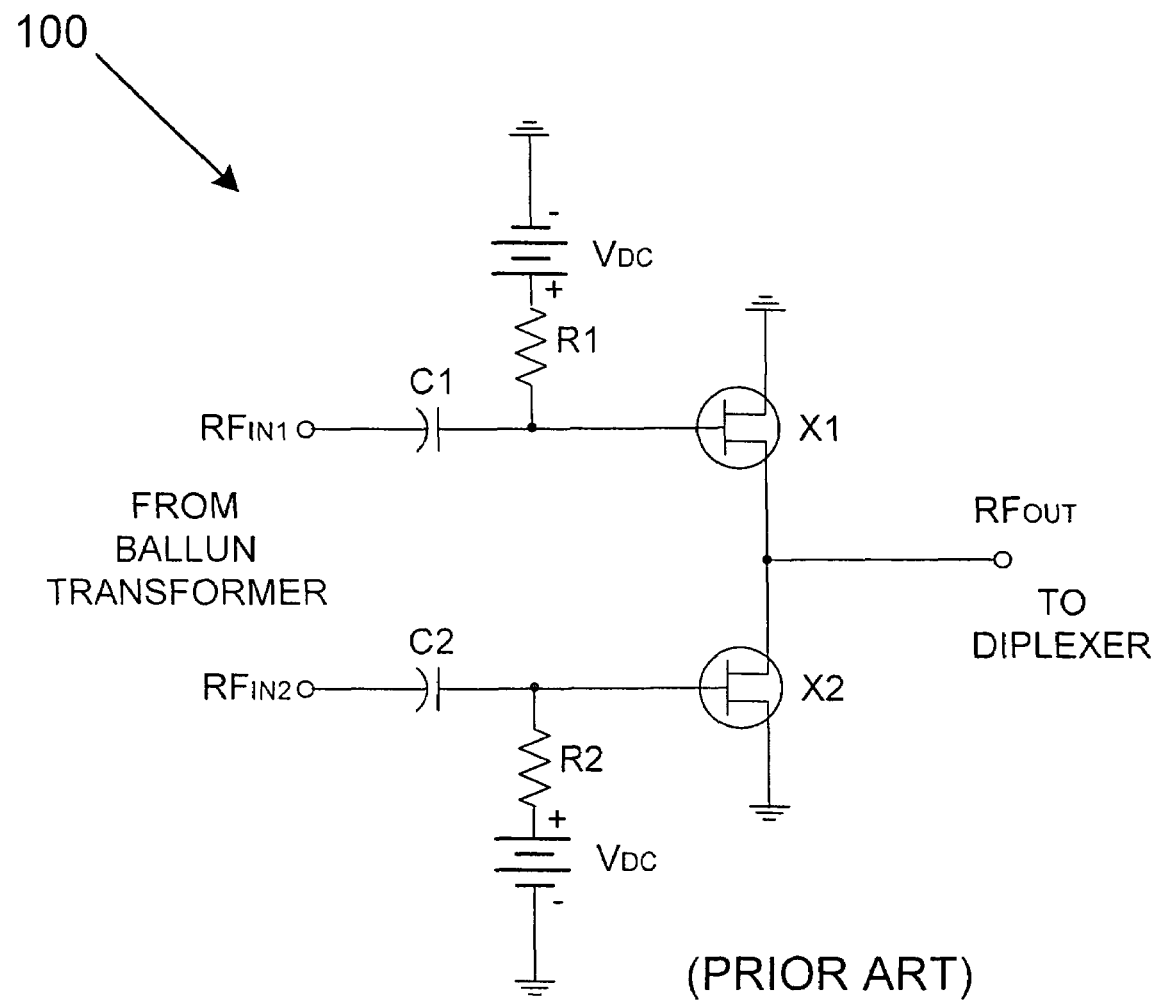
FIG. 1 is a known sub-harmonically pumped mixing circuit.
Figure 2:
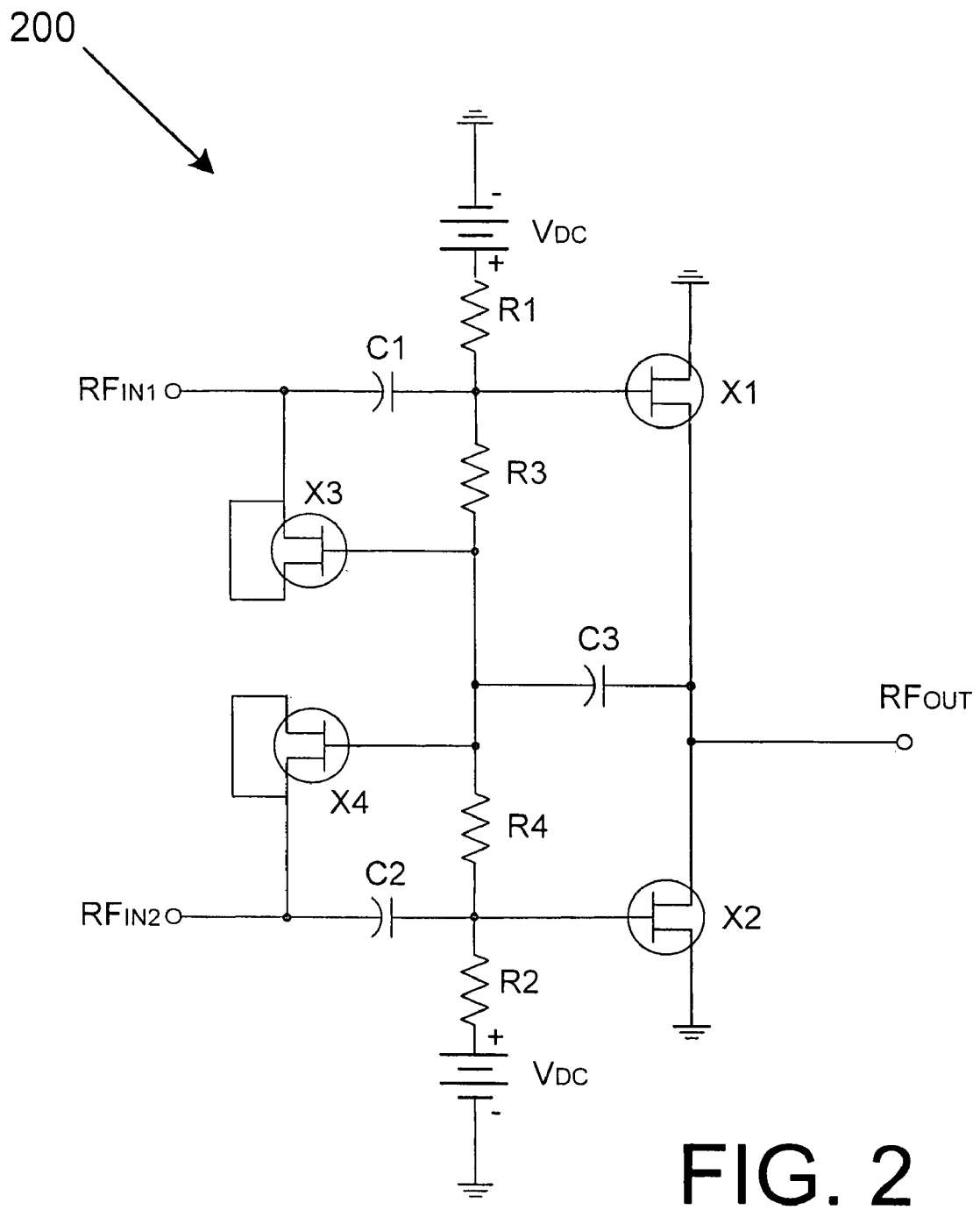
FIG. 2 is an improved sub-harmonically pumped mixing circuit according to an illustrative embodiment.

FIG. 2 is an improved sub-harmonically pumped mixing circuit according to an illustrative embodiment. As shown in FIG. 2, the improve sub-harmonically pumped mixing circuit 200 is similar to the mixing circuit 100 of FIG. 1 in that it includes two mixing FETs X1 and X2 each configured with respective sources directly tied to ground, their drains coupled together to form a common drain node ($RF_{OUT}$) and their gates respectively biased using resistors R1 and R2, which are tied to a biasing voltage $V_{DC}$. Additionally, the gates of transistors X1 and X2 are coupled to a local oscillator (not shown) via respective outputs of a balun transformer (not shown) and capacitors C1 and C2, and the common drain node/$RF_{OUT}$ is coupled to a diplexer (also not shown).

In contrast to the mixing circuit 100 of FIG. 1, the improved mixing circuit includes two additional FETs X3 and X4 that, together with a third capacitor C3, operate as anti-parallel diodes to the gate diodes inherent in FETs X1 and X2. As such, transistors X3 and X4 can provide a "symmetrizing effect" on the mixing circuit 200 to cancel the even-order harmonic signals that would otherwise be generated by FETs X1 and X2.

In various embodiments, it can be advantageous to bias the additional FETs X3 and X4 to operate at the same operating point as the original mixing FETs X1 and X2. This is because such biasing will enable the additional FETs X3 and X4 to mirror the behavior of the mixing FETs X1 and X2, which will in turn enable the mixing circuit 200 to provide the maximum cancellation of even-order harmonics. In practice, the biasing of the additional FETs X3 and X4 can be accomplished by judicially selecting the values of resistors R3 and R4, which in various embodiments can have large enough resistive values so as not to substantially contribute to the dynamics of mixing circuit other than by their DC biasing effects.

Note that the drains of FETs X3 and X4 are connected to the outputs of the balun transformer. Also note that, for the illustrative embodiment of FIG. 2, the source and drain for FET X3 are shorted together, and the source and drain for FET X4 are shorted together. This configuration effectively forms a Schottky diode between each of the gates of FETs X3 and X4 and their respective sources and drains.

In operation, the local oscillator (LO) can feed its oscillation signals to the inputs of the balun transformer, which in turn can provide the LO's oscillation signals to nodes $RF_{IN1}$ and $RF_{IN2}$.

When either of the LO signals at $RF_{IN1}$ and $RF_{IN2}$ reaches its positive half-cycle extreme, the inherent Schottky gate diode of the corresponding mixing FET X1 or X2 will be forward biased, and the signal path between that gate and the output node $RF_{OUT}$ to the diplexer will become more admissive. This is the mechanism that produces the unwanted second harmonic signals at the diplexer port $RF_{OUT}$.

However, whenever the LO signal at either $RF_{IN1}$ and $RF_{IN2}$ reaches its positive half-cycle extreme, the opposite LO signal should be at its negative half-cycle extreme. That is, for the mixing circuit 200 of FIG. 2, the diagonally arranged FETs can be simultaneously forward biased. As a result, the corresponding FET X4 or X3 will be forward biased and the signal path between that FET channel and the diplexer port $RF_{OUT}$ (through capacitor C3) will become more admissive. For example, when mixing transistor X1 is forward biased and generating second-order harmonic signals, transistor X4 will also be forward biased to generate a complementary second-order signal to cancel the distortion caused by mixing FET X1. Similarly, when mixing transistor X2 is forward biased and generating second-order harmonic signals, transistor X3 will also be forward biased to generate a complementary second-order signal to cancel the distortion caused by of mixing FET X2.

Figure 3:
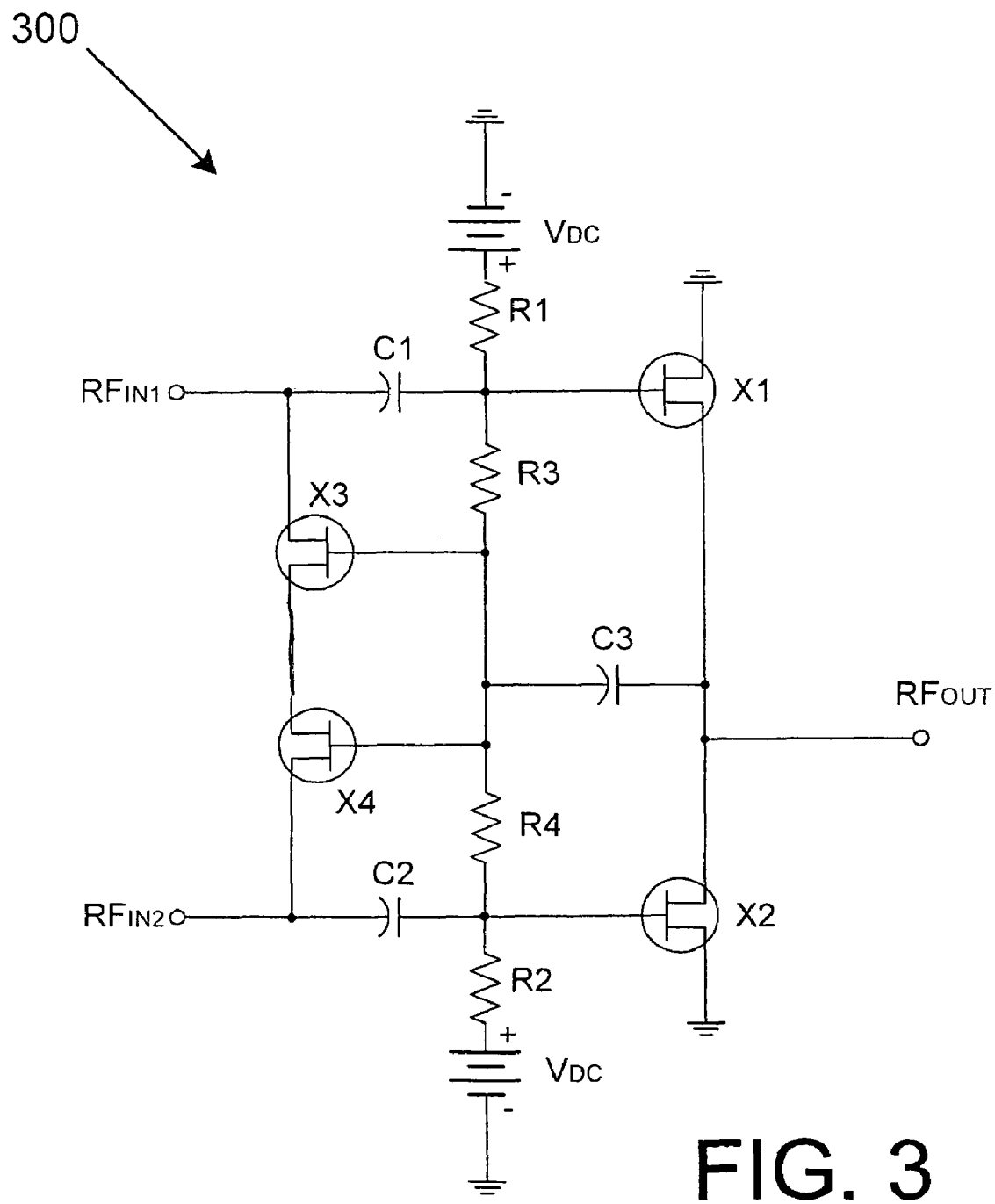
FIG. 3 is an improved sub-harmonically pumped mixing circuit according to another illustrative embodiment.

FIG. 3 is an improved sub-harmonically pumped mixing circuit 300 according to another illustrative embodiment. As shown in FIG. 3, the mixing circuit 300 of FIG. 3 is nearly identical to the mixing circuit 200 of FIG. 2 with the exception that the sources and drains of the additional/compensating FETs X3 and X4 are no longer shorted together and the sources are hanging open. While the overall structure of mixing circuit 300 is identical to that of FIG. 2, its performance will vary slightly as second-order effects come into play, i.e., parasitic capacitances and resistances change. Depending on the nature of the FETs X1-X4, this change in secondary parasitic capacitances and resistances may provide a net benefit or a net detriment.

Figure 4:
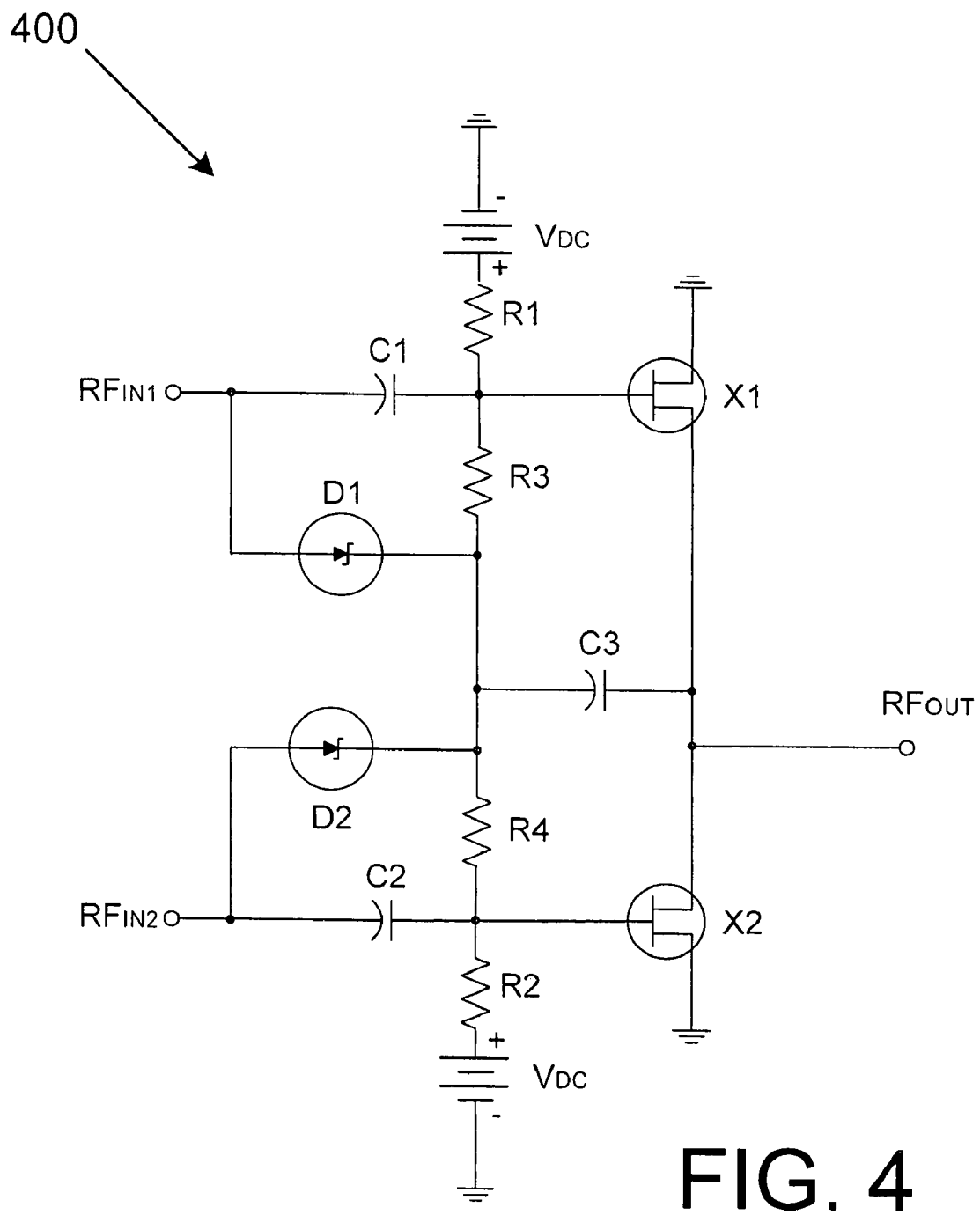
FIG. 4 is an improved sub-harmonically pumped mixing circuit according to yet another illustrative embodiment.

FIG. 4 is an improved sub-harmonically pumped mixing circuit 400 according to yet another illustrative embodiment. As shown in FIG. 4, the mixing circuit 400 of FIG. 4 is nearly identical to the mixing circuit 200 of FIG. 2 with the exception that FETS X3 and X4 are replaced by Schottky diodes D1 and D2. Again, while the overall structure of mixing circuit 400 is nearly identical to that of FIG. 2, its performance may vary slightly as the parasitic capacitances and resistances of diodes D1 and D2 may vary from the parasitic capacitances and resistances of FETs X3 and X4.

Figure 5:
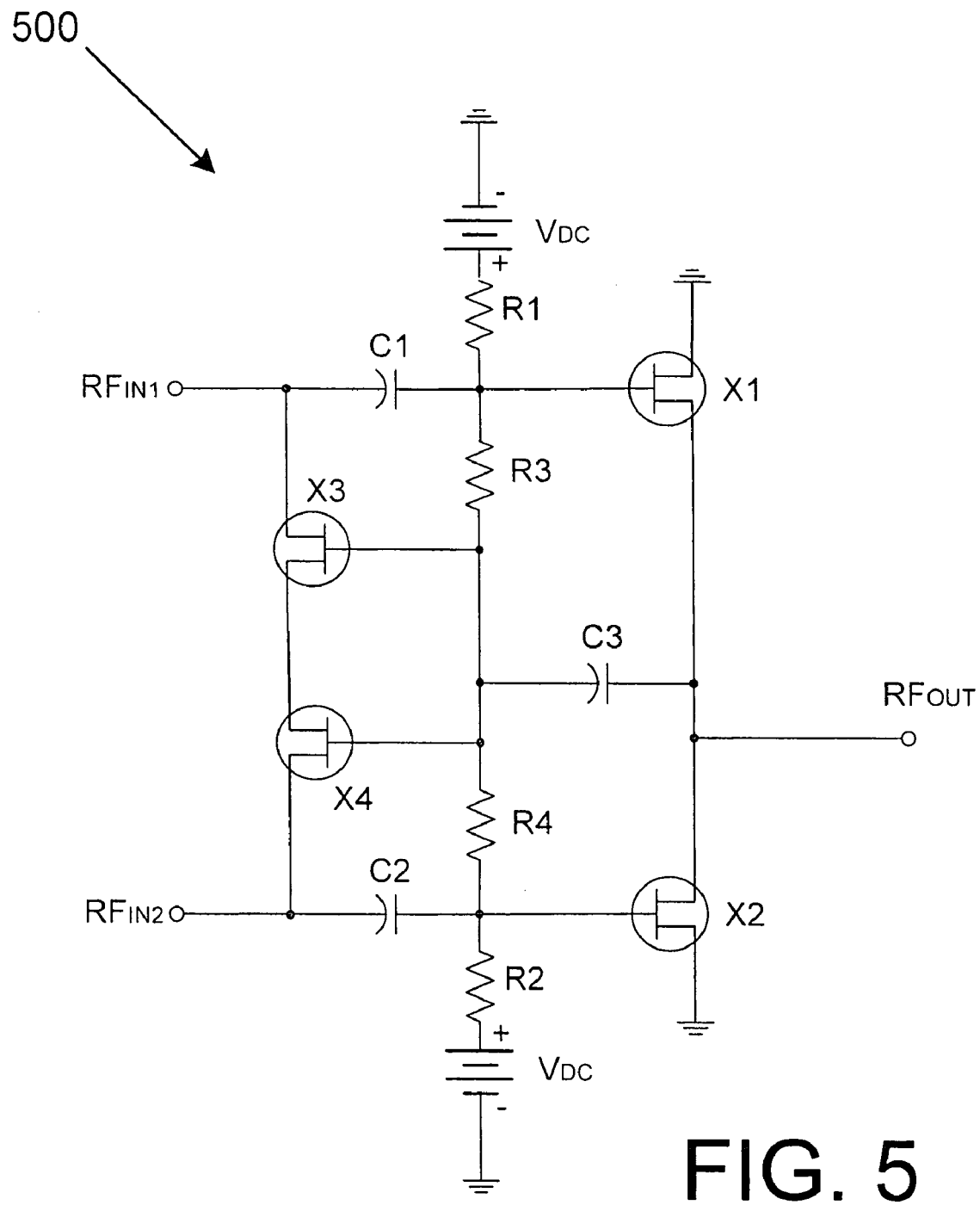
FIG. 5 is an improved sub-harmonically pumped mixing circuit according to still yet another illustrative embodiment.

FIG. 5 is an improved sub-harmonically pumped mixing circuit 500 according to still yet another illustrative embodiment. As shown in FIG. 5, the instant mixing circuit 500 is nearly identical to the mixing circuit 300 of FIG. 3 with the exception that the drains of the additional/compensating FETs X3 and X4 are no longer hanging open but are instead shorted together. Again, the overall performance of the mixing circuit 500 can be expected to be similar to that of the mixing circuits of FIGS. 2-4.

Figure 6:
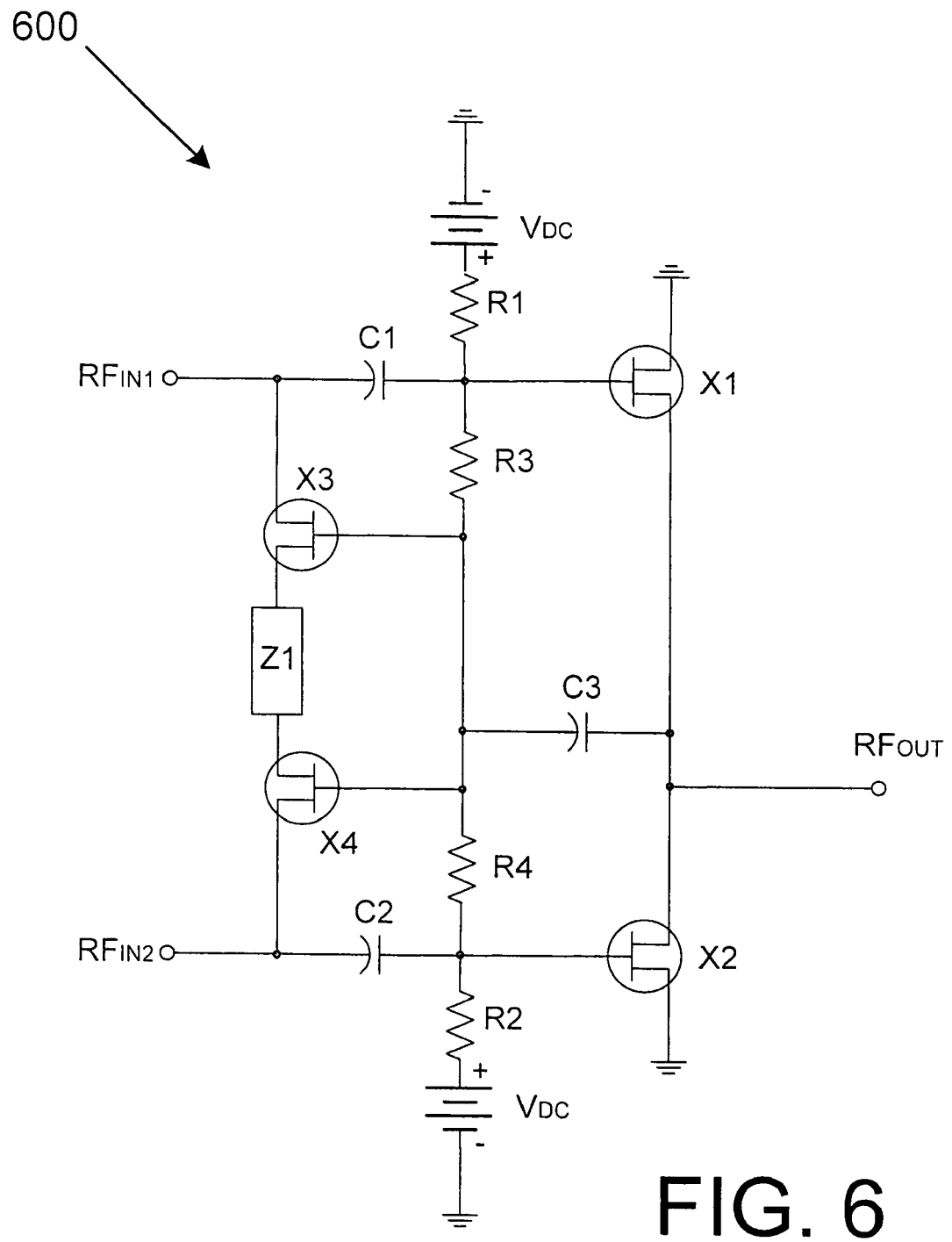
FIG. 6 is an improved sub-harmonically pumped mixing circuit according to still another illustrative embodiment.

FIG. 6 is an improved sub-harmonically pumped mixing circuit 600 according to still another illustrative embodiment. As shown in FIG. 6, the instant mixing circuit 600 is nearly identical to the mixing circuit 300 of FIG. 3 with the exception that FETs X3 and X4 are connected by an impedance device Z1 having an arbitrary impedance that is neither an open circuit, as with FIG. 3, or a short circuit, as with FIG. 5. Note that by choosing the appropriate impedance for device Z1, a null in the second-order harmonic leakage can be produced for a particular frequency of the LO. That is, by using an appropriate impedance for device Z1, the second-order cancellation performance at a particular narrow band of frequencies can be improved. Thus, the mixing circuit 600 of FIG. 6 can have a particular performance advantage for narrow-band mixers.

It may be expected to one of ordinary skill that the impedance of device Z1 may be selected through experimentation or simulation.

Also note that, for the various embodiments presented above, an appreciable amount of simulation and experimentation by the developer of the disclosed methods and systems has shown that it may be beneficial to configure the mixing FETs X1 and X2 to be twice the size of the additional FETs X3 and X4. In this disclosure, the term "size" is meant to refer to the area that a FET occupies on a substrate. Alternatively, the term "size" may refer to total gate periphery, i.e. gate width, in processes that construct the FET as a lateral device.

However, it should also be appreciated that the size of FETs X3 and X4 can depend on the LO balun output impedance for both odd and even modes, as well as for the particular embodiment chosen for use. Accordingly, while in most embodiments FETs X3 and X4 will be substantially smaller than FETs X1 and X2, the exact size ratios of the mixing FETs X1 and X2 to the additional/compensating FETS X3 and X4 can vary from embodiment to embodiment.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A mixing circuit, comprising:
a first field effect transistor (FET) having a gate, a source and a drain, the source of the first FET connected to a ground node, and the drain of the first FET connected to a first common node, wherein the first common node is coupled to a port of a diplexer;
a first capacitor coupling the gate of the first FET to a first output of a balun transformer;
a second FET having a gate, a source and a drain, the source of the second FET connected to the ground node, and the drain of the second FET connected to the first common node;
a second capacitor coupling the gate of the second FET to a second output of the balun transformer;
a third FET having a gate, a source and a drain with the gate of the third FET coupled to a second common node;
a fourth FET having a gate, a source and a drain with the gate of the fourth FET coupled to the second common node;
a third capacitor coupling the second common node to the first common node;
a resistor coupling the second common node to the gate of the first FET; and
another resistor coupling the second common node to the gate of the second FET.

2. The mixing circuit of claim 1, wherein a size of the third FET is substantially smaller than a size of the first FET.

3. The mixing circuit of claim 1, wherein the third FET is biased to approximately a same point as the second FET.

4. The mixing circuit of claim 1, wherein the third FET and the fourth FET are configured to operate as anti-parallel diodes with respect to gate diodes inherent in the first and second FETs.

5. The mixing circuit of claim 4, wherein the third FET and the fourth FET are configured to cancel second harmonics of the local oscillator's signal generated by the first FET and the second FET.

6. The mixing circuit of claim 1, wherein the drain of the third FET is coupled to the gate of the first FET via the first capacitor, and the drain of the fourth FET is coupled to the gate of the second FET via the second capacitor.

7. The mixing circuit of claim 6, wherein the sources of both the third and fourth FET are not appreciatively coupled to any other node of the mixing circuit.

8. The mixing circuit of claim 6, wherein the source and the drain of the third FET are shorted together, and the source and the drain of the fourth FET are shorted together.

9. The mixing circuit of claim 6, wherein the source of the third FET and the source of the fourth FET are shorted to each other.

10. The mixing circuit of claim 6, further comprising a first impedance device coupling the source of the third FET and the source of the fourth FET, wherein the first impedance device has an impedance that is appreciably neither a zero impedance nor an infinite impedance.

11. The mixing circuit of claim 10, wherein the impedance of the first impedance device causes the mixer to produce a null in second-order local oscillation signal leakage at a first frequency of the local oscillator.

12. A mixing circuit, comprising:
a first field effect transistor (FET) having a gate, a source and a drain, the source of the first FET connected to a ground node, and the drain of the first FET connected to a first common node, wherein the first common node is coupled to a port of a diplexer;
a first capacitor coupling the gate of the first FET to a first output of a balun transformer;
a second FET having a gate, a source and a drain with the source of the second FET being connected to the ground node, and the drain of the second FET being connected to the first common node;
a second capacitor coupling the gate of the second FET to a second output of the balun transformer;
a third capacitor; and
a cancellation means for canceling second-order harmonics, the cancellation means being coupled to the first common node via the third capacitor.

13. The mixing circuit of claim 12, wherein the cancellation means is a third FET and a fourth FET.

14. The mixing circuit of claim 13, wherein the third and fourth FETs are configured to operate as anti-parallel diodes with respect to gate diodes inherent in the first and second FETs.

15. A mixing circuit, comprising:
a first field effect transistor (FET) having a gate, a source and a drain, the source of the first FET connected to a ground node, and the drain of the first FET connected to a first common node, wherein the first common node is coupled to a port of a diplexer;
a first capacitor coupling the gate of the first FET to a first output of a balun transformer;
a second-order cancellation device having at least a first terminal and a second terminal, the second-order cancellation device configured to cancel second-order harmonics generated by the first FET, wherein the second-order cancellation device is directly coupled to a second common node via the first terminal; and
a third capacitor coupling the second common node to the first common node.

16. The mixing circuit of claim 15, wherein the second terminal of the second-order cancellation device is coupled to the first output of the local oscillator's balun transformer.

17. The mixing circuit of claim 16, wherein the second-order cancellation device is a third FET having its gate directly coupled to the second common node and its drain coupled to the first output of the local oscillator's balun transformer.

18. The mixing circuit of claim 17, wherein the second common node is further coupled to the gate of the first FET via a resistor.

19. The mixing circuit of claim 17, wherein the drain of the third FET is coupled to the gate of the first FET via the first capacitor.

20. The mixing circuit of claim 17, wherein the third FET is biased to approximately a same point as the first FET.

* * * * *